(12) United States Patent
Hasegawa

(10) Patent No.: US 6,188,339 B1
(45) Date of Patent: Feb. 13, 2001

(54) DIFFERENTIAL MULTIPLEXER AND DIFFERENTIAL LOGIC CIRCUIT

(75) Inventor: Yasumasa Hasegawa, Ebina (JP)

(73) Assignee: Fuji Photo Film Co., Ltd., Kanagawa (JP)

( * ) Notice: Under 35 U.S.C. 154(b), the term of this patent shall be extended for 0 days.

(21) Appl. No.: 09/229,673

(22) Filed: Jan. 13, 1999

(30) Foreign Application Priority Data

Jan. 23, 1998 (JP) .................................... 10-11739
Jan. 23, 1998 (JP) .................................... 10-11741

(51) Int. Cl.[7] .................................... H03M 9/00

(52) U.S. Cl. .................... 341/101; 326/115; 341/100

(58) Field of Search ................... 341/101, 100; 326/115, 110, 112, 105; 327/408, 404, 416

(56) References Cited

U.S. PATENT DOCUMENTS 6,008,670 * 12/1999 Pace et al. .......................... 326/115

* cited by examiner

*Primary Examiner*—Brian Young
*Assistant Examiner*—John Nguyen
(74) *Attorney, Agent, or Firm*—Sughrue, Mion, Zinn, Macpeak & Seas, PLLC

(57) ABSTRACT

A differential multiplexer has first and second differential input pairs for receiving first and second input signals, a transistor for making active the first differential input pair by using as a control signal a first clock of a pair of differential first and second clocks, another transistor for making active the second differential input pair by using as a control signal the second clock, a first output terminal for outputting the first input signal if the first clock is larger than the second clock and outputting the second input signal if the second clock is larger than the first clock, and a second output terminal for outputting a paired differential signal of the signal output from the first output terminal.

21 Claims, 11 Drawing Sheets

DIFFERENTIAL MULTIPLEXER AND DIFFERENTIAL LOGIC CIRCUIT

This application is based on Japanese patent applications No. 10-11739 filed on Jan. 23, 1998, and No. 10-11741 filed on Jan. 23, 1998, the whole contents of which are incorporated herein by reference.

BACKGROUND OF THE INVENTION a) Field of the Invention

The present invention relates to a multiplexer for selectively outputting input signals, and more particularly to a differential multiplexer for selecting an input signal in response to a pair of differential clocks and outputting a pair of differential signals, and to a differential logic circuit using such a differential multiplexer.

b) Description of the Related Art

Some of conventional audio and video apparatuses have analog input/output terminals. Audio and video signals are transferred in analog forms to and from these apparatuses. Analog communications are now being replaced by digital communications. Of various digital communications, IEEE 1394 digital serial communications have drawn attention.

FIG. 2 shows a configuration of a communication network of IEEE 1394.

For example, this network has five nodes (communication apparatuses) ND1 to ND5 connected by cables BS. In the following, all the nodes are called collectively as a node ND or each node is also called a node ND. Each node ND has a node ID (identifier). For example, the node ND1 has an identifier of "1", the node ND2 has an identifier of "2", the node ND3 has an identifier of "3", the node ND4 has an identifier of "4", and the node ND5 has an identifier of "5". Of these nodes, the node having a largest node ID is a root node. In this example, the node ND5 is the root node.

FIG. 3 shows the structure of one node ND.

A node ND has an IEEE 1394 interface 1 and a device 4. The device 4 is, for example, an audio apparatus, a video apparatus, a computer, or the like. The IEEE 1394 interface 1 is constituted of a combination of a link layer (semiconductor chip) 2 and a physical layer (semiconductor chip) 3. The physical layer 3 transfers a signal directly to and from a cable BS, and the link layer 2 transfers a signal to and from the device 4.

The cable BS has two sets of twisted pair. One set of twisted pair transfers a pair of differential data signals Data and −Data having opposite phases. The other set of twisted pair transfers a pair of differential strobe signals Strobe and −Strobe having opposite phases. The strobe signal Strobe is a DS encoded signal of the data signal Data. The details will be later described with reference to FIG. 4.

A signal rate of the fours signals propagating on the cable BS is any one of the three rates selected from 98.304 Mbits/sec (hereinafter represented by 100 Mbps for convenience), 196.608 Mbits/sec (also 200 Mbps), and 393.216 Mbits/sec (also 400 Mbps).

The physical layer 3 is required to have an internal clock of 100 MHz if the serial data Data is transmitted at 100 Mbps, an internal clock of 200 MHz if transmitted at 200 Mbps, or an internal clock of 400 MHz if transmitted at 400 Mbps.

Data TxD is transferred between the link layer 2 and physical layer 3 always at 49.152 MHz (hereinafter represented by 50 Mbps for convenience) irrespective of the signal rate selected. The data TxD corresponds to parallel data of serial-parallel converted serial data Data. The data TxD is a parallel signal of 400/50 Mbps=8 bits if the serial data Data has a signal rate of 400 Mbps, a parallel signal of 200/50 Mbps=4 bits if a signal rate of 200 Mbps, or a parallel signal of 100/50 Mbps=2 bits if a signal rate of 100 Mbps. It is assumed in the following description that the serial data Data is transferred at 400 Mbps.

FIG. 4 shows the circuit structure of a conventional physical layer 3, and FIG. 6 is a timing chart illustrating the operation of the circuit. In the following description, it is assumed that the physical layer 3 transmits the signals Data, −Data, Strobe, and −Strobe over the cable BS.

The physical layer 3 parallel-serial converts input 8-bit parallel data TxD[0] to TxD[7] and outputs pairs of differential data signals Data and −Data, as well as pairs of differential strobe signals Strobe and −Strobe. The strobe signals Strobe and −Strobe are signals obtained by DS encoding the data signals Data and −Data, and are transmitted in place of clocks signals (e.g., 400 MHz). A partner physical layer receives the data signals Data and −Data and strobe signals Strobe and −Strobe, and reproduces clock signals by decoding the data and strobe signals. The IEEE 1394 specification stipulates that the physical layer transmits the fours signals Data, −Data, Strobe, and −Strobe over the cable BS.

Eight selectors SEL0 to SEL7 and eight D-type flip-flops FF0 to FF7 are respectively (alternately) and serially connected to constitute a well-known parallel-serial converter circuit. This parallel-serial converter circuit converts 8-bit parallel data TxD[0] to TxD[7] into serial data N1.

The 8-bit parallel data TxD[0] to TxD[7] is input to first input terminals of the eight selectors SEL0 to SEL7. The eight selectors SEL0 to SEL7 select and output signals on the first input terminals while a select signal Mux_sel takes a high level, and select and output signals on second input terminals while the select signal Mux_Sel takes a low level. The D-type flip-flops FF0 to FF7 hold and output input signals D as output signals Q in response to a positive (rise) edge of a clock Clk1.

The 8-bit data TxD[0] to TxD[7] is actually transferred via eight parallel signal lines. In FIG. 5, the 8-bit data TxD[0] to TxD[7] is shown collectively for simplicity. The data TxD[0] to TxD[7] has a signal rate of 50 Mbps, signals D0 to D7 are transferred during a first cycle, and signals D8 to D15 are transferred during a second cycle. For example, during the first cycle, signals TxD[0]=D0, TxD[1]=D1, TxD[2]=D2, TxD[3]=D3, TxD[4]=D4, TxD[5]=D5, TxD[6]=D6, and TxD[7]=D7 are transferred.

Clocks Clk1 and Clk2 have a clock frequency of 400 MHz (2.5 ns period). The select signal Mux_Sel has a frequency of 50 MHz (20 ns period). A signal enc has a frequency of 200 MHz (5 ns period).

As shown in FIG. 5, when the select signal Mux_Sel takes the high level, the selector SEL0 selects the data D0 (TxD[0]) at the first input terminal and outputs it to an input terminal D of the flip-flop FF0, and the selector SEL1 selects the data D1 (TxD[1]) at the first input terminal and outputs it to an input terminal D of the flip-flop FF1. Similarly, the selectors SEL2 to SEL7 select data D2 to D7 and output them to input terminals D of the flip-flops FF2 to FF7.

Thereafter, when the clock Clk1 rises, the flip-flop FF0 outputs the data D0 at the input terminal D as serial data N1, and the flip-flop FF1 outputs the data D1 at the input terminal D as an output signal Q. Similarly, the flip-flops FF2 to FF7 output the data D2 to D7 as output signals Q which are applied to the second input terminals of the preceding selectors SEL1 to SEL6.

Next, when the select signal Mux_Sel takes the low level, the selector SEL0 selects the data D1 (T×D[1]) at the second input terminal and outputs it to the input terminal D of the flip-flop FF0, and the selector SEL1 selects the data D2 (T×D[2]) at the second input terminal and outputs it to the input terminal D of the flip-flop FF1. Similarly, the selectors SEL2 to SEL6 select data D3 to D7 and output them to the input terminals D of the flip-flops FF2 to FF6. The selector SEL7 selects a ground signal gnd and outputs it to the input terminal D of the flip-flop FF7.

Thereafter, when the clock Clk1 rises, the flip-flop FF0 outputs the data D1 at the input terminal D as the serial data N1, and the flip-flop FF1 outputs the data D2 at the input terminal D as the output signal Q which is applied to the second input terminal of the selector SEL0. Similarly, the flip-flops FF2 to FF7 output the data D3 to D7 as output signals Q which are applied to the second input terminals of the preceding selectors SEL1 to SEL5. The flip-flop FF7 outputs the ground signal gnd as the output signal Q which is supplied to the second input terminal of the preceding selector SEL6.

Operations similar to the above are repeated to sequentially output D0 to D7 as the serial data N1, and thereafter D8 to D15 are sequentially output.

An exclusive logical sum (XOR) circuit 10 calculates a logical sum of the serial data N1 and signal enc to output a strobe signal N2 of the strobe signal Strobe.

The strobe signal N2 is delayed from the serial data N1 by a process time of the XOR circuit 10. In order to synchronize the signals N1,N2 and the like, D-type flip-flops FF11 to FF14 are provided.

The D-type flip-flops FF11 to FF14 output signals at the input terminals D from the output terminals Q in response to a positive edge of the clock Clk2. The flip-flop FF11 outputs the data N1 input to the input terminal D from the output terminal Q as the data signal Data. The flip-flop FF12 outputs the inverted data N1 input to the input terminal D from the output terminal Q as the paired differential data signal –Data. The flip-flop FF13 outputs a strobe signal N2 input to the input terminal D from the output terminal Q as the strobe signal Strobe. The flip-flop FF14 outputs the inverted strobe signal N2 input to the input terminal D from the output terminal Q as the paired differential strobe signal –Strobe. All the data signals Data and –Data and strobe signals Strobe and –Strobe are transmitted at 400 Mbps synchronously with the clock Clk2.

The 8-bit parallel data T×D[0] to T×D[7] has the signal rate of 50 Mbps. The serial data signals Data and –Data and strobe signals Strobe and –Strobe have the signal rate of 400 Mbps (=50 Mbps×8 bits).

The clock Clk1 of 400 MHz (2.5 ns period) becomes necessary for parallel-serial conversion, and the clock Clk2 of 400 MHz (2.5 ns period) becomes necessary for synchronization among the output signals Data, –Data, Strobe, and –Strobe.

Namely, in order to transmit four output signals at 400 Mbps, the clocks Clk1 and Clk2 of 400 MHz are required.

According to the IEEE 1394 specifications, any signal rate can be selected from 100 Mbps, 200 Mbps, and 400 Mbps. Presently, IEEE 1394 interfaces compatible with the signal rate of 100 Mbps and 200 Mbps are mainly used. It is sufficient if clocks of 200 MHz are supplied to the physical layer in this interface, and clocks of 400 MHz are not necessary.

However, IEEE 1394 interfaces compatible with the signal rate of 400 Mbps are under development. The physical layer of this interface requires the clocks Clk1 and Clk2 of 400 MHz as described above.

As compared to 200 Mbps compatible IEEE 1394 interfaces, the 400 Mbps compatible interfaces require clocks of higher frequency. In order to use clocks of higher frequency, more sophisticated semiconductor process technologies are required to realize high speed operation and high precision alignment, so that the manufacturing cost of physical layers increases. As the clock frequency is doubled, the power consumption is also doubled.

Markets desire 400 Mbps compatible physical layer semiconductor chips which can suppress the power consumption to the same degree as 200 Mbps compatible physical layer semiconductor chips. However, this market needs cannot be satisfied as yet because it is difficult to halve the power consumption.

If the power source voltage is lowered, the power consumption can be lowered. However, if the power source voltage is lowered, a stable operation cannot be expected.

Another problem is that pairs of differential data signals Data and –Data and differential strobe signals Strobe and –Strobe to be output from the physical layer are likely to have time delays jitters).

SUMMARY OF THE INVENTION

It is an object of the present invention to provide a differential multiplexer capable of outputting a pair of differential signals having small jitters.

It is another object of the present invention to provide a parallel-serial conversion differential logic circuit capable of parallel-serial conversion with clocks of low frequency.

According to one aspect of the present invention, there is provided a differential multiplexer comprising: a first differential input pair including first and second transistors, the first differential input pair using as control signals a first input signal and an inverted first input signal; a second differential input pair including third and fourth transistors, the second differential input pair using as control signals a second input signal and an inverted second input signal; a fifth transistor for making active the first differential input pair by using as a control signal a first clock of first and second clocks forming a pair of differential clocks; a sixth transistor for making active the second differential input pair by using as a control signal the second clock; a first constant current source for supplying a constant current to branched paths to the first and second transistors; a second constant current source for supplying a constant current to branched paths to the second and fourth transistors, the first and second current sources constituting a current mirror; a first output terminal connected to the branch paths of the second and fourth transistors for outputting the first input signal when the first clock is larger than the second clock, and outputting the second input signal when the second clock is larger than the first clock; and a second output terminal connected to the first and third transistors for outputting a paired differential signal of a signal output from the first output terminal.

A pair of first differential input signals is supplied to the first differential input pair, and a pair of second differential input signals is supplied to the second differential input pair. The first differential input pair is made active by using the first clock of a pair of differential first and second clocks, whereas the second differential input pair is made active by using the second clock of the differential clock pair. The first output terminal outputs the first input signal if the first clock is larger than the second clock, and outputs the second input signal if the second clock is larger than the first clock. The second output terminal outputs the paired differential signal of the signal output from the first output terminal.

One of the first and second input signals is selected in accordance with which one of the pair of differential clocks is larger. Therefore, a pair of differential signals can be output. The pair of differential clocks has opposite phases so that the jitter of a pair of differential output signals becomes very small.

According to another aspect of the present invention, there is provided a parallel-serial conversion differential logic circuit comprising: parallel-serial converting means for converting a parallel signal into a serial signal, the parallel-serial converting means including a plurality of selectors and a plurality of double-edge trigger flip-flops using a first clock as a trigger, the selectors and flip-flops being respectively connected in series; first serial-parallel converting means for converting the serial signal converted by the parallel-serial converting means into two-bit parallel signals, the first serial-parallel converting means including two single edge trigger flip-flops using a second clock as a trigger, the second clock having a same frequency as the first clock; and a first differential multiplexer for selecting one bit signal of the two-bit parallel signals converted by the first serial-parallel converting means, in accordance with which one of a pair of differential clocks having opposite phases and a same frequency as the first clock is larger, and serially outputting the one bit signal at a speed corresponding to a speed of a clock having a twofold frequency of the first clock.

The parallel signal is converted into the serial signal by using the first clock as a trigger. If a single edge trigger flip flop is used, a serial signal having a signal rate corresponding to the frequency same as the first clock is obtained However, if a double-edge trigger flip-flop is used, a serial signal having a signal rate corresponding to a clock having a twofold frequency of the first clock can be obtained. However, this serial signal contains a relatively large jitter.

The serial signal is thereafter converted into two-bit parallel signals. A signal rate of the converted parallel signal is halved as compared to the serial signal. Thereafter, one bit signal is selected from the converted two-bit parallel signals, in accordance with which one of the pair of differential clocks having opposite phases and the same frequency is larger. Therefore, the selected one bit signal can be serially output at a speed corresponding to the clock having a twofold frequency of the first clock. This serial output signal has a very small jitter.

The parallel signal can be converted into the serial signal by using low frequency clocks and the serial signal can be output at high speed. The serial output signal has a very small jitter.

By operating the differential logic circuit with low frequency clocks, it becomes unnecessary to use sophisticated semiconductor process technologies which are required to realize high speed operation and high precision alignment, so that the manufacture cost can be lowered.

Furthermore, since the clock frequency is lowered, the stable operation is ensured while the power consumption is reduced so that market needs can be satisfied.

DETAILED DESCRIPTION OF THE PREFERRED EMBODIMENTS

Figure 1:
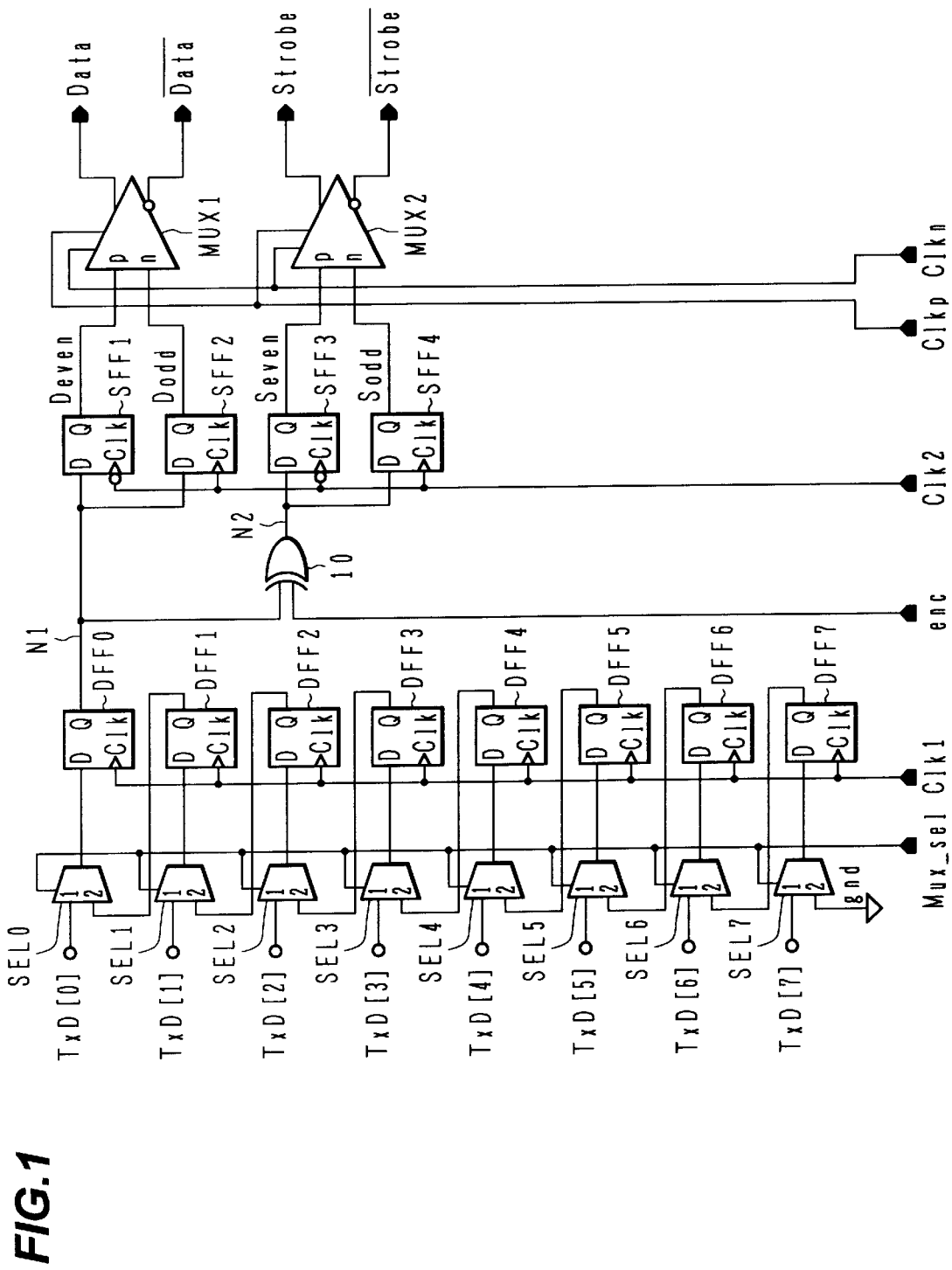
FIG. 1 is a circuit diagram of a physical layer according to an embodiment of the invention.
Figure 2:
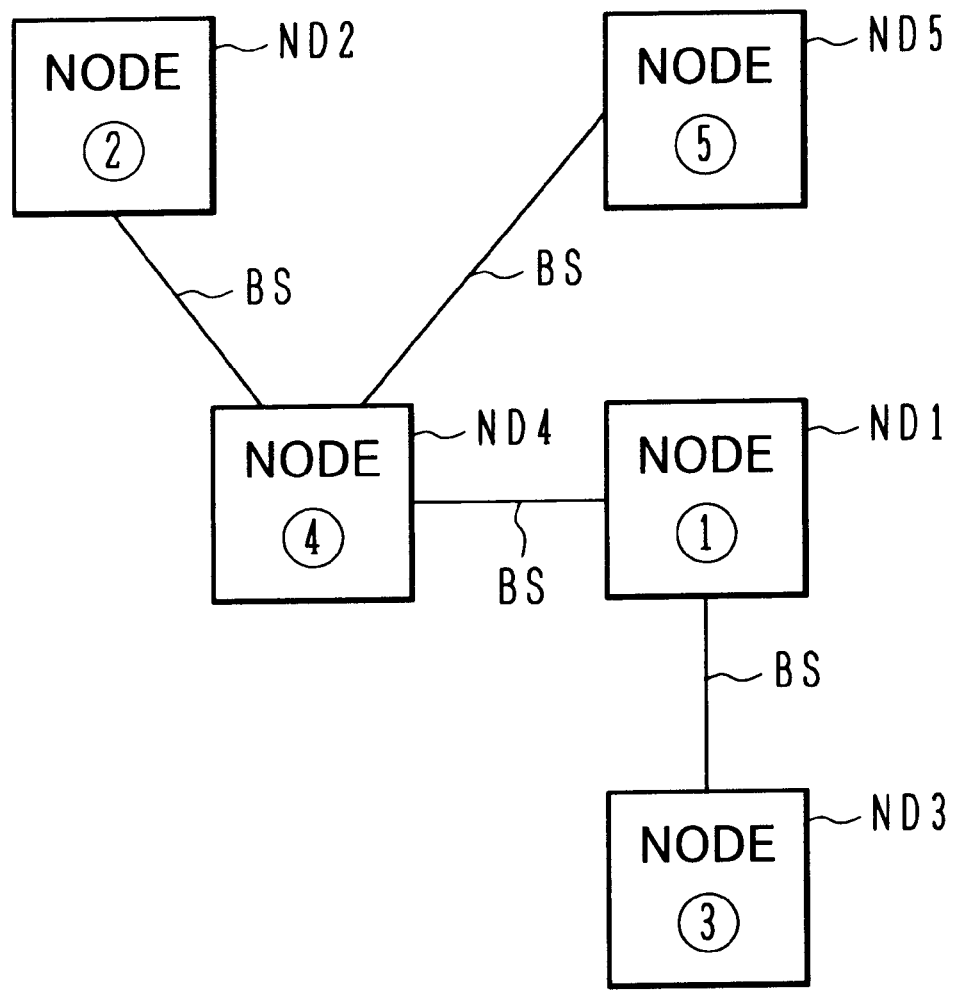
FIG. 2 is a block diagram showing the configuration of a network.
Figure 3:
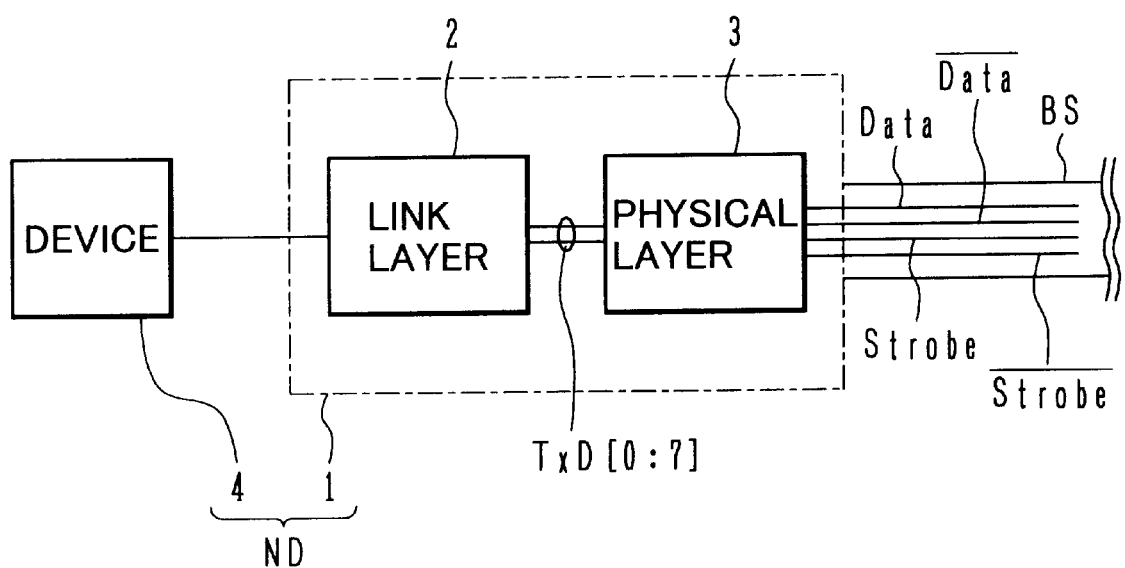
FIG. 3 is a block diagram showing the structure of a node in a communication network.
Figure 6:
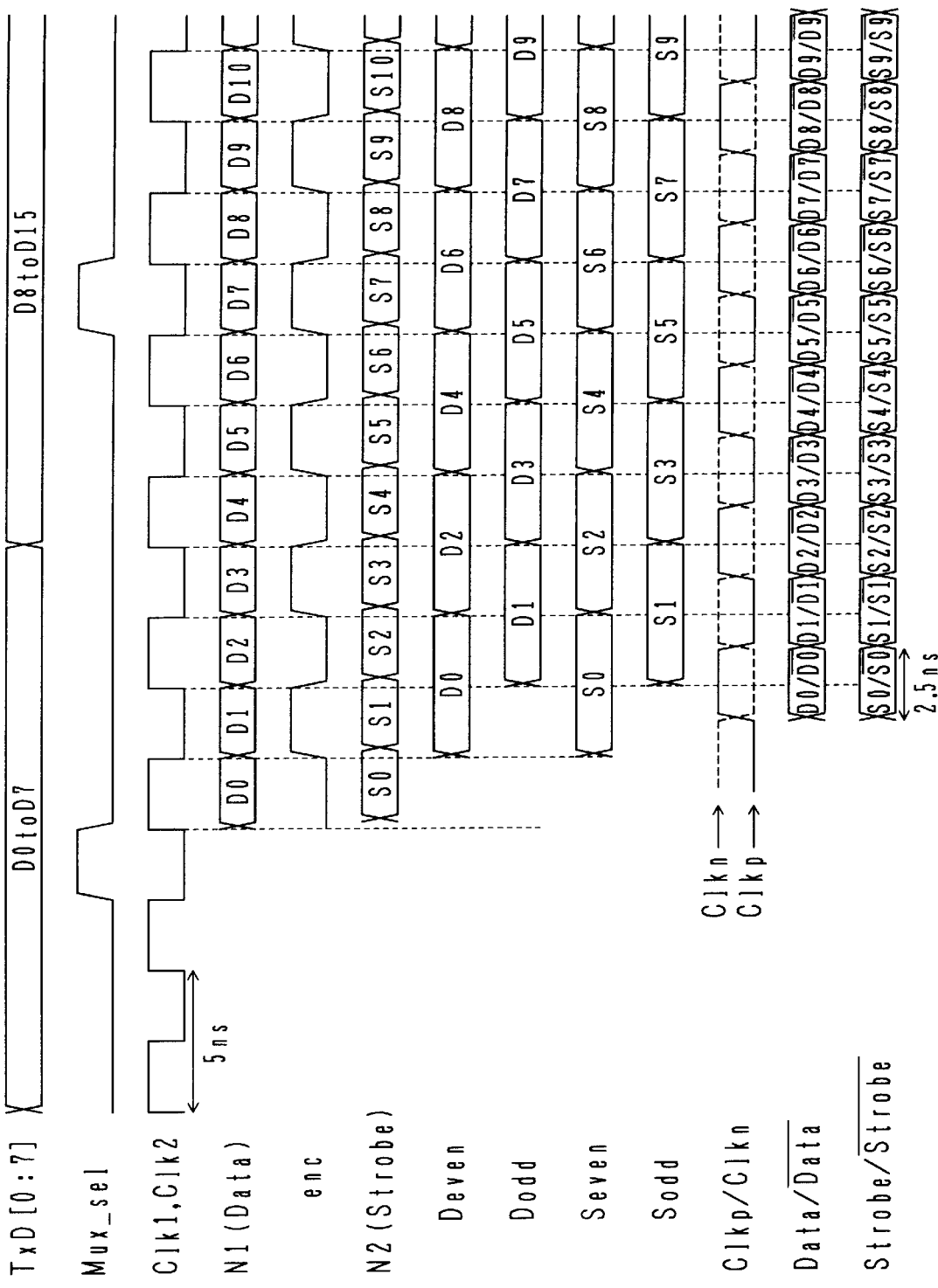
FIG. 6 is a timing chart illustrating an operation of the physical layer shown in FIG. 1.

FIG. 1 shows the circuit structure of a physical layer 3 according to an embodiment of the invention, and FIG. 6 is a timing chart illustrating the an operation of the physical layer 3. The physical layer 3 is the same as that used in the node ND shown in FIG. 3. In the following description, the physical layer 3 transmits signals Data, –Data, Strobe, and –Strobe over the cable BS.

The physical layer 3 parallel-serial converts input 8-bit parallel data TxD[0] to TxD[7] and outputs pairs of differential serial data signals Data and –Data, as well as pairs of differential strobe signals Strobe and –Strobe. The strobe signals Strobe and –Strobe are signals obtained by DS encoding the data signals Data and –Data, and are transmitted in place of clocks signals (e.g., 400 MHz). A partner physical layer receives the data signals Data and –Data and strobe signals Strobe and –Strobe, and reproduces clock signals by decoding the data and strobe signals.

The physical layer 3 parallel-serial converts the signals Data, –Data, Strobe, and –Strobe by using clocks Clk1 and Clk2 of a relatively low frequency 200 MHz instead of using clocks of a high frequency 400 MHz, and transmits the converted signals over the cable BS at 400 MHz.

A main difference of the physical layer 3 from the conventional physical layer 3 (FIG. 4) is that the embodiment physical layer 3 has double-edge trigger flip-flops DFF0 to DFF7 and differential multiplexers MUX1 and MUX2. The double edge trigger flip-flops DFF0 to DFF7 use both the positive (rise) and negative (fall) edges as their triggers. The differential multiplexers MUX1 and MUX2 are novel devices proposed by the present inventor. The details thereof will be given later.

Eight selectors SEL0 to Sel 7 and eight double-edge trigger flip-flops DFF0 to DFF7 are respectively (alternately) and serially connected to constitute a parallel-serial converter circuit. Similar to that shown in FIG. 4, this parallel-serial converter circuit converts 8-bit parallel data TxD[0] to TxD[7] into serial data N1. In the following, only the different points of the physical layer 3 shown in FIGS. 1 and 6 from that shown in FIGS. 4 and 5 will be described.

Figure 4:
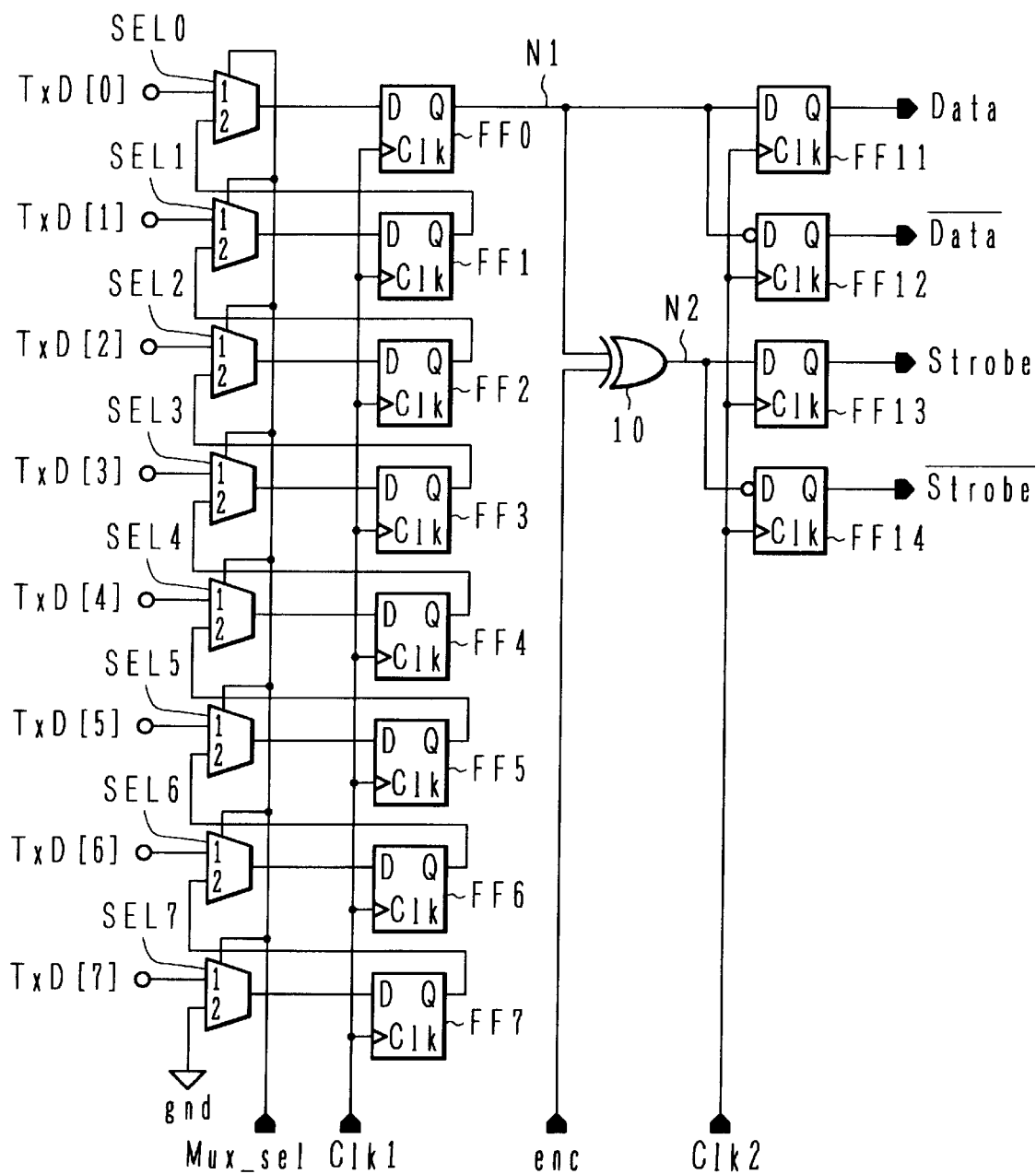
FIG. 4 is a circuit diagram of a conventional physical layer.
Figure 5:
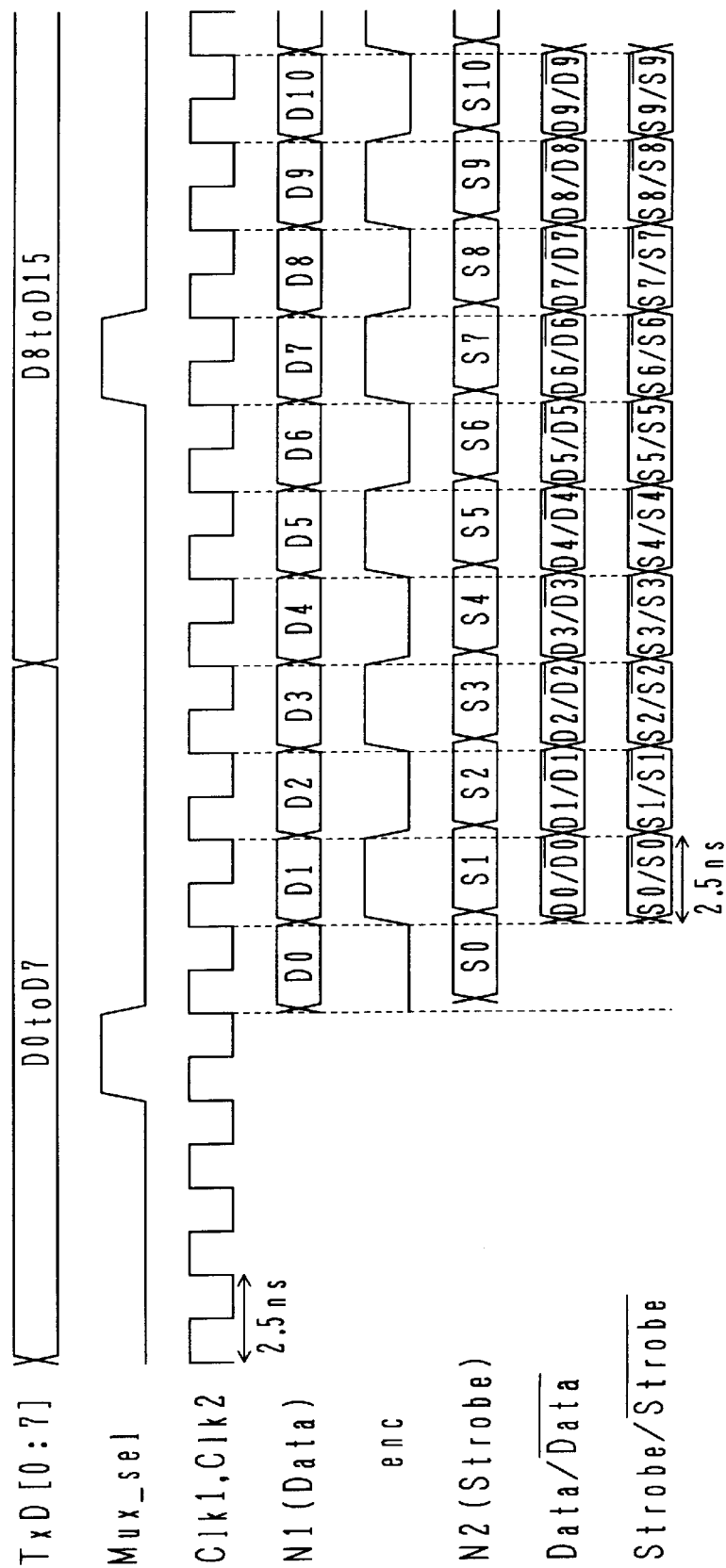
FIG. 5 is a timing chart illustrating an operation of the physical layer shown in FIG. 4.

In this embodiment, in place of the single edge trigger flip-flops FF0 to FF7 shown in FIG. 4, the double-edge trigger flip-flops DFF0 to DFF7 are used. The double-edge trigger flip-flops DFF0 to DFF7 hold and output input signals D as output signals Q, by using double edges (positive and negative edges) of the clock Clk1 as triggers.

The clocks Clk1 and Clk2 shown in FIG. 4 have a frequency of 400 MHz (2.5 ns period). In this embodiment, the clocks Clk1 and Clk2 have a frequency of 200 MHz (5 ns period). In this embodiment, the operation same as the physical layer shown in FIG. 4 can be executed with low frequency clocks of 200 MHz instead of high frequency clocks of 400 MHz.

As shown in FIG. 6, the double-edge trigger flip-flops DFF0 to DFF7 output serial data N1 by using the double edges of the clock Clk1 having a frequency of 200 MHz as triggers. As the serial data N1, data D0 to D7 is sequentially output and then data D8 to D15 is sequentially output.

If a single edge (either a positive or negative edge) of the clock Clk1 having a frequency of 200 MHz is used as triggers, serial data N1 of 200 Mbps is obtained. However, by using the double edges of the clock Clk1 having a frequency of 200 MHz as triggers as in the embodiment, serial data N1 of 400 Mbps can be obtained.

An XOR circuit 10 performs a logical sum of the serial data N1 and a clock signal enc to output a strobe signal N1 of 400 Mbps. The strobe signal N2 includes data S0, S1, S2, S3, S4, S5, . . . , sequentially in this order which is delayed from the serial data N1 by a process time of the XOR circuit 10.

The strobe signals N1 and N2 having a frequency of 400 MHz, however, cannot be transmitted directly to another node. The reason for this will be described by taking the strobe signal N1 as an example.

Figure 7A:
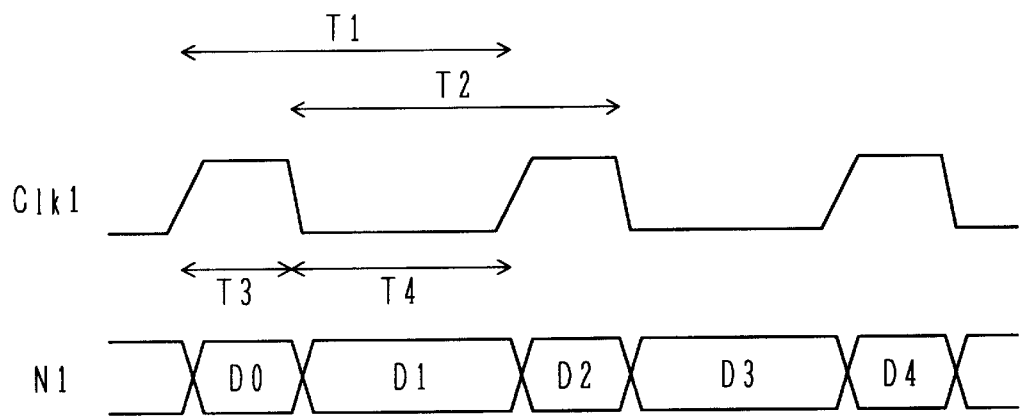
FIG. 7A is a timing chart shown in a large scale of a clock signal Clk1 and a serial signal N1 shown in FIG. 6.

FIG. 7A is a filing chart shown in a large scale of the clock signal Clk1 and serial strobe signal N2 shown in FIG. 6.

The clock Clk1 is generated by a known phase locked loop (PLL) circuit.

A time period T1 is a time from a positive edge of the clock Clk1 to the next positive edge. A time period T2 is a time from a negative edge of the clock Clk1 to the next negative edge. The time periods T1 and T2 are nearly equal.

A time period T3 is a time from a positive edge of the clock Clk1 to the next negative edge. A time period T4 is a time from a negative edge of the clock Clk1 to the next positive edge. The time periods T3 and T4 are usually different because of a difference between rise and fall characteristics of the clock Clk1.

More specifically, this difference is caused by characteristics of CMOS transistors of the PLL circuit. In a CMOS circuit, the positive edge of the clock Clk1 depends on the on-characteristics of an n-channel MOS transistor, and the negative edge of the clock Clk1 depends on the on-characteristics of a p-channel MOS transistor. It is difficult to have the same on-characteristics of both the n- and p-channel MOS transistors, and in addition, because of a temperature change and process variation, the time periods T3 and T4 are usually different.

If the time periods T3 and T4 are the same, the duty ratio of the clock Clk1 is 50%. However, it is difficult to set this duty ratio to 50% because there is often a time shift between the positive and negative edges. This time shift is a so-called jitter.

Because of a difference between the time period T3 of the data D0 and the time period T4 of the data D1, the serial data N1 has a jitter. If the duty ratio of the clock Clk1 is 50%, the jitter of the data N1 is not present. However, from the above reason, the duty ratio of the clock Clk1 is difficult to be set to 50%, and therefore the data N1 has a jitter.

The IEEE 1394 specification stipulates that the jitter contained in an output signal should be 0.15 ns or shorter when the output signals Data, −Data, Strobe, and −Strobe have the signal rate of 400 Mbps. Since the jitter of the data N1 becomes longer than 0.15 ns, the IEEE 1394 specification cannot be satisfied.

If the output signals Data, −Data, Strobe, and −Strobe are reproduced from the data N1 in the manner similar to the physical layer shown in FIG. 4, a skew among the four output signals becomes large. The skew is an average (collective) time shift between synchronized signals.

The IEEE 1394 specification stipulates that the skew among the output signals Data, −Data, Strobe, −Strobe should be 0.1 ns or shorter when the output signals have the signal rate of 400 Mbps. Since the skew among the output signals reproduced in the above manner becomes longer than 0.1 ns, the IEEE 1394 specification cannot be satisfied.

From the above reasons, as shown in FIG. 1, the signal N1 is input to input terminals D of single edge trigger D-type flip-flops SFF1 and SFF1, and a signal N2 which is an output from the XOR circuit 10 is input to input terminals D of single edge trigger D-type flip-flops SFF3 and SFF4.

The flip-flow SFF1 outputs the input signal N1 (at terminal D) as an output signal Deven (at terminal Q) by using the negative edge of the clock Clk1 having a frequency of 200 MHz. The input signal N1 of 400 Mbps is therefore converted into the output signal Deven of 200 Mbps. The output signal Deven includes even number data D0, D2, D4, . . . among the input signal N1.

The flip-flow SFF2 outputs the input signal N1 (at terminal D) as an output signal Dodd (at terminal Q) by using the positive edge of the clock Clk1 having a frequency of 200 MHz. The output signal Dodd has a signal rate of 200 Mbps and includes odd number data D1, D3, D5, . . . among the input signal N1.

The flip-flops SFF1 and SFF2 therefore convert the serial data N1 of 400 Mbps into two-bit parallel data Deven and Dodd of 200 Mbps.

The flip-flop SFF3 outputs the input signal N2 (at terminal D) as an output signal Seven (at terminal Q) by using the negative edge of the clock Clk2 having a frequency of 200 MHz. The output signal Seven has a signal rate of 200 Mbps and includes even number data S0, S2, S4, . . . among the input signal N2.

The flip-flop SFF4 outputs the input signal N2 (at terminal D) as an output signal Sodd (at terminal Q) by using the positive edge of the clock Clk2 having a frequency of 200 MHz. The output signal Sodd has a signal rate of 200 Mbps and includes odd number data S1, S3, S5, . . . among the input signal N2.

The flip-flops SFF3 and SFF4 therefore convert the serial data N2 of 400 Mbps into two-bit parallel data Seven and Sodd of 200 Mbps.

The differential multiplexer MUX1 has a positive input terminal p and a negative input terminal n. The signal Deven is applied to the input terminal p, and the signal Dodd is applied to the input terminal n. The differential multiplexer MUX1 uses a pair of differential clocks Clkp and Clkn as select signals. The differential clocks Clkp and Clkn have a frequency of 200 MHz and opposite phases.

The differential multiplexer MUX1 outputs the signal Deven at the input terminal p as a pair of differential data signals Data and −Data, if the select signal Clkp is larger than the select signal Clkn.

On the other hand, if the select signal Clkn is larger than the select signal Clkp, the differential multiplexer MUX1 outputs the signal Dodd at the input terminal n as a pair of differential data signals Data and −Data. The differential clocks Clkp and Clkn have a frequency of 200 MHz. A pair of differential signals Data and −Data have opposite phases and a signal rate of 400 Mbps.

The differential multiplexer MUX2 receives the signal Seven at its positive input terminal p and the signal Sodd at its negative input terminal n, and uses a pair of differential clocks Clkp and Clkn as its select signals.

The differential multiplexer MUX2 outputs the signal Seven at the input terminal p as a pair of differential signals Strobe and −Strobe, if the select signal Clkp is larger than the select signal Clkn.

On the other hand, if the select signal Clkn is larger than the select signal Clkp, the differential multiplexer MUX2 outputs the signal Dodd at the input terminal n as a pair of differential signals Strobe and −Strobe. The differential clocks Clkp and Clkn have a frequency of 200 MHz. A pair of differential signals Strobe and −Strobe have opposite phases and a signal rate of 400 Mbps.

The differential multiplexers MUX1 and MUX2 synchronize the four output signals Data, −Data, Strobe, and −Strobe by using the differential clocks Clkp and Clkn as the select signals.

Since the differential multiplexers MUX1 and MUX2 use the differential clocks Clkp and Clkn as the select signals, a jitter of the output signal can be made almost zero. The reason for this will be described by using the output signal Data of the differential multiplexer MUX1 as an example.

Figure 7B:
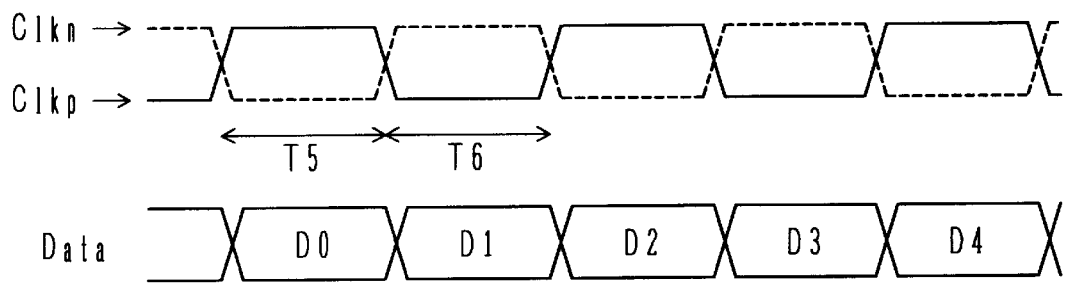
FIG. 7B is a timing chart shown in a large scale of differential clock signals Clkp and Clkn shown in FIG. 6.

FIG. 7B is a timing chart shown in a large scale of a pair of differential clocks Clkp and Clkn of shown in FIG. 6.

The differential clocks Clkp and Clkn have opposite phases. A time period T5 is a time from a first cross point between the differential clocks Clkp and Clkn to the next cross point. A time period T6 is a time from a second cross point between the differential clocks Clkp and Clkn to the next third cross point. The time periods T5 and T6 are nearly equal.

The differential multiplexer MUX1 switches the output signal at the cross point between the differential clocks Clkp and Clkn. Therefore, of the output signal Data, the time period T5 of the data D0 becomes equal to the time period T6 of the data D1. The jitter of the output signal Data therefore becomes nearly zero. Similarly, the skew of the four output signals becomes nearly zero.

In this embodiment, it is possible to reduce the jitter and skew of the output signals Data, −Data, Strobe, and −Strobe and the IEEE 1394 specification can be satisfied. Furthermore, the physical layer 3 does not require clocks of 400 MHz, and it is sufficient if clocks of 200 MHz are provided.

The physical layer 3 of this embodiment operates at low frequency clocks of 200 MHz. Therefore, as compared to the conventional physical layer (FIG. 4) operating at high frequency clocks of 400 MHz, it is not necessary to use sophisticated semiconductor process technologies which are required to realize high speed operation and high precision alignment, so that the manufacture cost can be lowered. Furthermore, since the clock frequency is lowered, the stable operation is ensured while the power consumption is reduced so that market needs can be satisfied.

Figure 8:
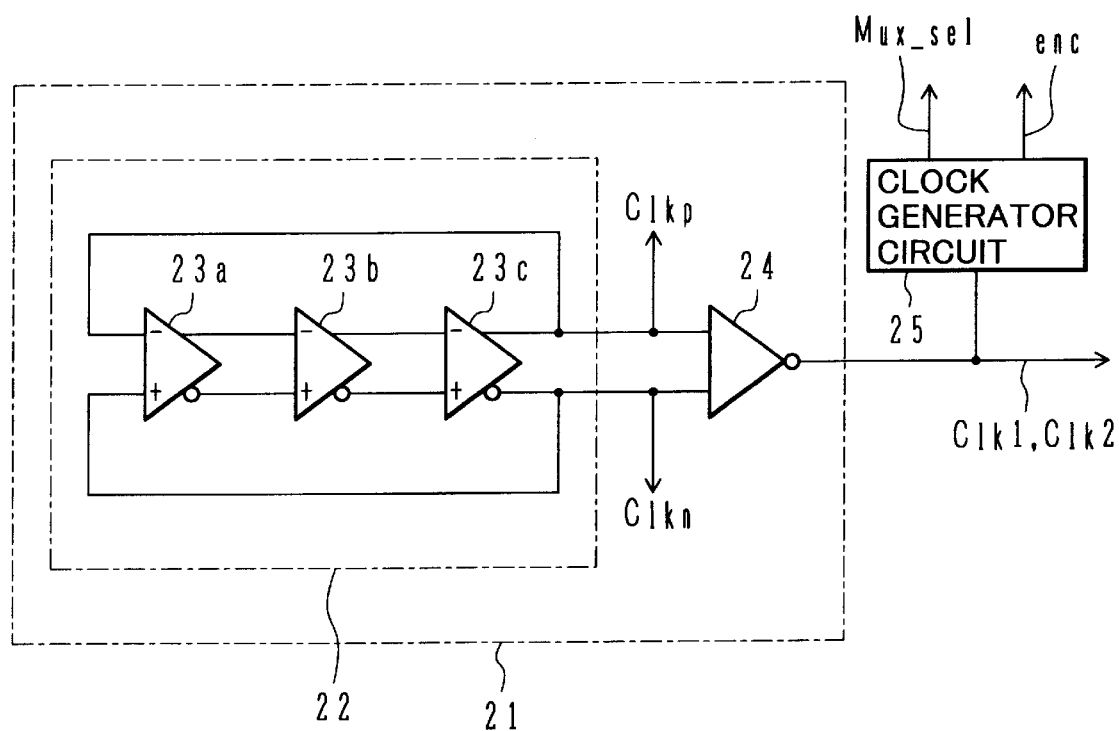
FIG. 8 is a circuit diagram showing the structure of a signal generator.

FIG. 8 shows the structure of a signal generator for generating signals to be supplied to the physical layer 3 shown in FIG. 1.

The phase locked loop (PLL) circuit 21 is a known general circuit and has a voltage controlled oscillator (VCO) 22. VCO 11 has an odd number (e.g., three) of differential delay blocks 23a, 23b, and 23c. In the following, all or each of the differential delay blocks 23a, 23b, and 23c is simply called a differential delay block 23, where applicable.

The three differential delay blocks 23 are serially connected. An output signal of the last stage third differential delay block 23c is fed back to an input terminal of the first differential delay block 23a.

An output signal of each differential delay block 23 is inverted and supplied to the next stage differential delay block 23. For example, a non-inverted output signal of the first differential delay block 23a is input to an inverting input terminal of the second differential delay block 23b, and the inverted output signal of the first differential delay block 23a is input to a non-inverting input terminal of the second differential delay block 23b.

Signals output from the three differential delay blocks 23 have a phase shift of 120°. VCO 22 outputs a pair of differential clocks Clkp and Clkn having a frequency of 200 MHz. The differential clocks Clkp and Clkn have opposite phases (a phase difference of 180°), and are supplied to the differential multiplexers MUX1 and MUX2 shown in FIG. 1.

PLL 21 has an output stage 24 in addition to VCO 22. The output stage 24 receives the differential clocks Clkp and Clkn of 200 MHz and output clocks Clk1 and Clk2 of 200 MHz. The clocks Clk1 and Clk2 may be the same signal or different signals so long as they have the same frequency of 200 MHz. In this embodiment, the same signal is used for the clock signals Clk1 and Clk2.

The clock Clk1 is supplied to the double-edge trigger flip-flops DFF0 to DFF7 shown in FIG. 1, and the clock Clk2 is supplied to the single edge trigger flip-flops SFF1 to SFF4 shown in FIG. 1.

A clock generator circuit 25 generates a signal enc of 200 MHz and a signal Mux_Sel of 50 MHz from the clocks Clk1 and Clk2 of 200 MHz. The signal enc is supplied to the XOR circuit 10 shown in FIG. 1 and the signal Mux_Sel is supplied to the selectors SEL0 to SEL7.

Figure 9:
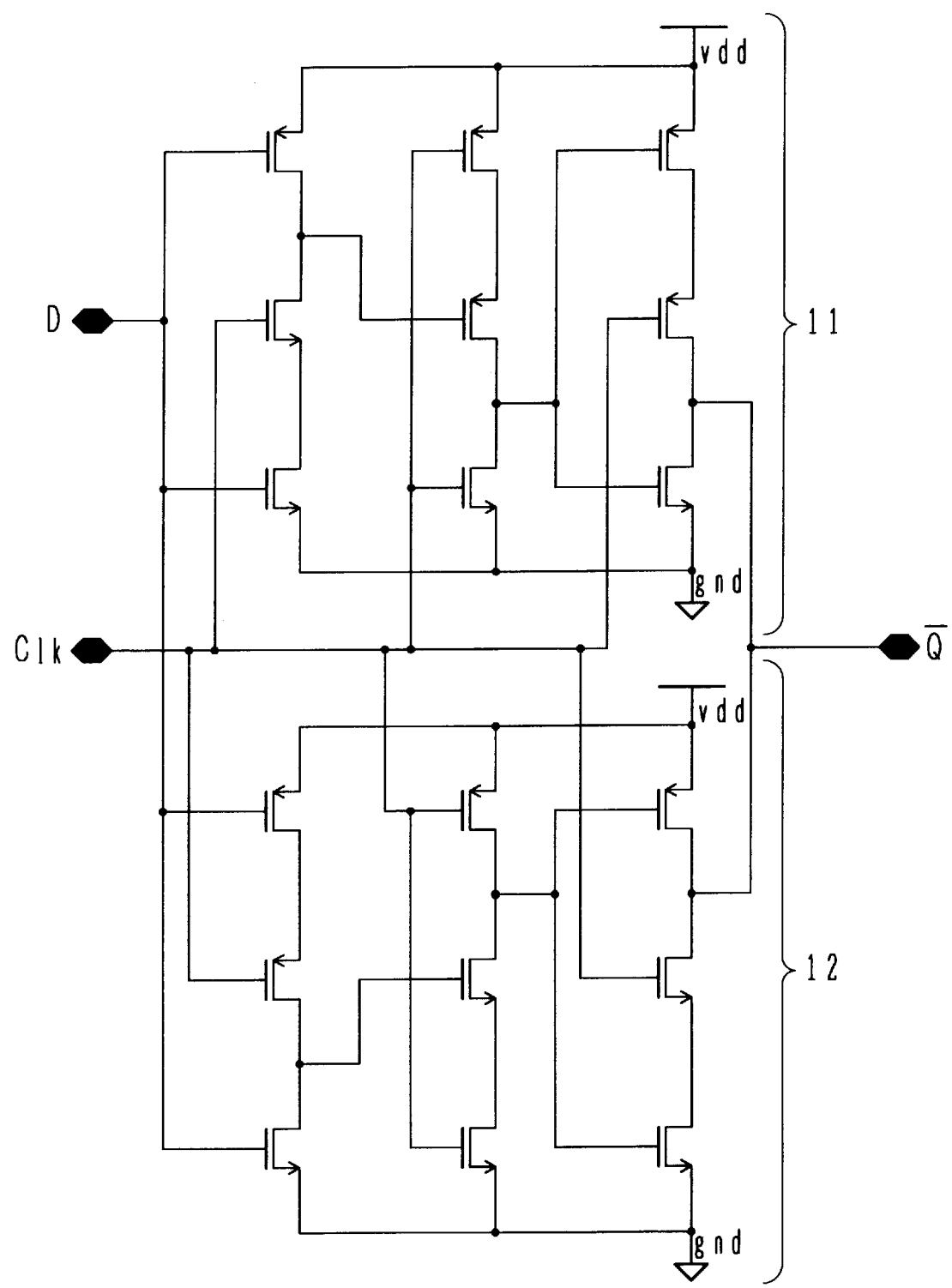
FIG. 9 is a circuit diagram of a double-edge trigger flip-flop.

FIG. 9 is a circuit diagram of each of the double-edge trigger D-type flip-flops DFF0 to DFF7 shown in FIG. 1.

The flip-flops DFF0 to DFF7 are made of CMOS circuits. An input signal is applied to an input terminal D, and a clock signal Clk1 is applied to a clock terminal Clk. In FIG. 9, although an inverted output terminal −Q is shown, the output terminal Q shown in FIG. 1 can be provided by inverting a signal at the output terminal −Q.

In FIG. 9, a terminal vdd is a positive potential terminal of a power source, and a terminal gnd is a ground potential terminal. Each of the flip-flops DFF0 to DFF7 has an upper circuit portion 11 and a lower circuit portion 12. The upper circuit portion 11 is a flip-flop which is triggered by the negative edge of the clock Clk1, whereas the lower circuit portion 11 is a flip-flop which is triggered by the positive edge of the clock Clk1.

An output of the upper circuit portion 11 takes a high impedance state when the clock Clk1 takes a high level, and an output of the lower circuit portion 12 takes a high impedance state when the clock Clk1 takes a low level. Therefore, there is no conflict between the outputs of the upper and lower circuit portions 11 and 12, and the output signals can be derived from the output terminal −Q by using the double edges of the clock Clk1 as triggers.

As a double-edge trigger flip-flop, a circuit may be used which is described in the document "IEEE Journal of Solid-state Circuits, vol. 26, No. 8, August, 1991" at pp. 1168 to 1170.

Figure 10:
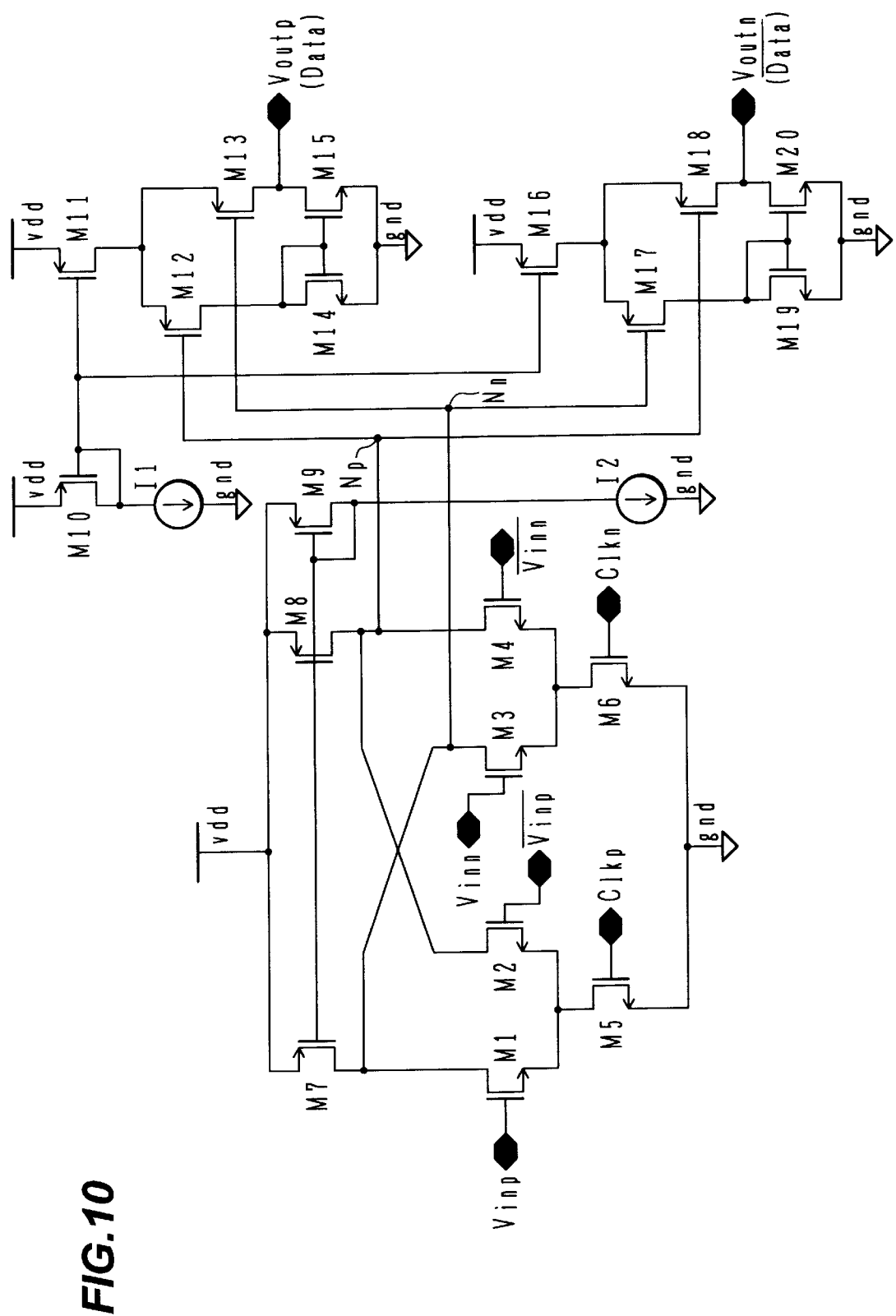
FIG. 10 is a circuit diagram of a differential multiplexer.

FIG. 10 is a circuit diagram of each of the differential multiplexers MUX1 and MUX2 shown in FIG. 1. The differential multiplexers MUX1 and MUX2 are made of CMOS circuits. In the following, the MOS transistor is called simply a transistor. In FIG. 10, a terminal vdd is a positive potential terminal of a power source, and a terminal gnd is a ground potential terminal.

The differential multiplexer has four nodes Vinp, −Vinp, Vinn, and −Vinn.

Figure 11A:
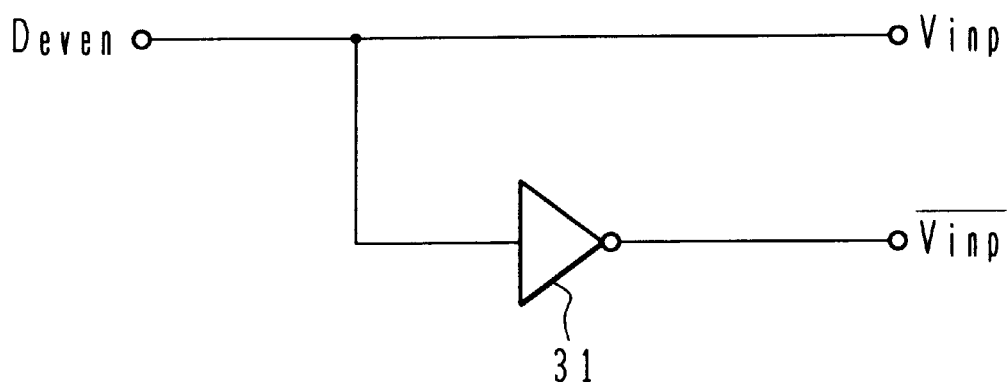
FIGS. 11A and 11B are circuit diagrams of circuits which generate signals input to a differential multiplexer.
Figure 11B:
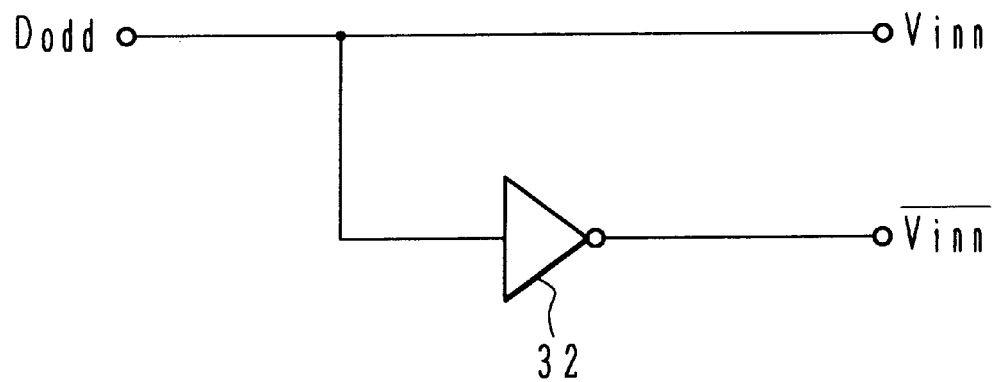

As shown in FIG. 11A, even number data Deven (FIG. 1) is input to the positive input node Vinp, and even number data Deven inverted by an inverter (NOT) circuit 31 is input to the positive inverting input node −Vinp. As shown in FIG. 11B, odd number data Dodd (FIG. 1) is input to the negative input node Vinn, and odd number data Dodd inverted by an inverter (NOT) circuit 32 is input to the negative inverting input node −Vinn.

In addition, the differential multiplexer has differential clock nodes Clkp and Clkn and differential output nodes Voutp and Voutn. From the positive output node Voutp, the output signal Data or Strobe shown in FIG. 1 is output. From the negative output node Voutn, the output signal −Data or −Strobe shown in FIG. 1 is output.

If the positive clock Clkn is larger than the negative clock Clkn, the signal at the positive input node Vinp is output from the positive output node Voutp, and the paired differential signal of the signal output from the positive output node Voutp is output from the negative output node Voutn.

If the positive clock Clkn is smaller than the negative clock Clkn, the signal at the negative input node Vinn is output from the positive output node Voutp, and the paired differential signal of the signal output from the positive output node Voutp is output from the negative output node Voutn.

The positive input node Vinp is connected to the gate of an n-channel transistor M1. The positive inverting input node −Vinp is connected to the gate of an n-channel transistor M2.

The negative input node Vinn is connected to the gate of an n-channel transistor M3. The negative inverting input node −Vinn is connected to the gate of an n-channel transistor M4.

The drains of the transistors M1 and M3 are connected to the drain of a p-channel transistor M7 and a negative node Nn. The drains of the transistors M2 and M4 are connected to the drain of a p-channel transistor M8 and a positive node Np.

A constant current source 12 is connected at its one end to the ground terminal and at its other end to the drain of a p-channel transistor M9. The sources of the transistors M7, M8, and M9 are connected to the positive potential terminal vdd. The gate of the transistors M7, M8, and M9 are connected in common. The drain and gate of the transistor M9 are connected in common. The transistors M7 and M8 together with the transistor M9 constitute a current mirror circuit. The transistors M7 and M8 can flow a current having the same amount as the current of the transistor M9. The transistors M7 and M8 may be replaced by a constant current source.

The positive clock node Clkp is connected to the gate of an n-channel transistor M5. The negative clock node Clkn is connected to the gate of an n-channel transistor M6.

The drain of the transistor M5 is connected to the sources of the transistors M1 and M2, and the source thereof is connected to the ground terminal gnd. The drain of a transistor M6 is connected to the sources of the transistors M3 and M4, and the source thereof is connected to the ground terminal gnd.

Next, the operation of the circuit will be described. First, the circuit operation when the positive clock Clkp is larger than the negative clock Clkn will be described. Namely, the positive clock Clkp takes the high level (hereinafter represented by "H") and the negative clock Clkn takes the low level (hereinafter represented by "L"). When the negative clock Clkn takes the low level, the transistor M6 turns off so that the current will not flow through the transistors M3 and M4 irrespective of the logical values of the negative inputs Vinn and −Vinn.

Consider for example the case wherein the positive input Vinp=H and the positive inverting input −Vinp=L. In this case, the transistor M1 turns on and the transistor M2 turns off.

As the transistor M1 turns on and current flows through the source-drain, the potential at the negative node Nn lowers and eventually to the point of the negative node Nn=L. As the transistor M2 turns off and current does not flow through the source-drain, the potential at the positive node Np rises and eventually to the point of the positive node Np=H.

As above, if the positive clock Clkp is larger than the negative clock Clkn, the positive input Vinp=H is output from the positive node Np. Since the transistors M1 and M2 constitute an input differential amplifier, the paired differential signal of the signal at the positive node Np is output from the negative node Nn.

These positive node Np and negative node Nn can be used as the output terminals. Namely, from the positive node Np, the signals Data and Strobe shown in FIG. 1 are output, and from the negative node Nn, the signals −Data and −Strobe shown in FIG. 1 are output.

If the load connected to the output terminal is small, the above circuit structure can be used as the differential multiplexer. However, if the load is large, the output stages described in the following are required to be connected to the above-described circuit in order to realize current amplification.

Transistors M11, M12, M13, M14, and M15 constitute an output stage for the positive output node Voutp. Transistors M16, M17, M18, M19, and M20 constitute an output stage of the negative output node Voutn.

A constant current source 11 is connected to the drain of a p-channel transistor M10. The p-channel transistors M11 and M16 together with the transistor M10 constitute a current mirror circuit. The sources of the transistors M10, M11, and M16 are connected to the positive potential terminal vdd. The transistors M11 and M16 can flow a current having the same amount of the current of the transistor M10. The transistors M11 and M16 may be replaced by a constant current source.

Next, the circuit operation will be described. The positive node Np is connected to the gates of the transistors M12 and M18, and the negative node Nn is connected to the gates of the transistors M13 and M17. Similar to the above-described circuit operation, the operation when the potential at the positive node Np rises and the potential at the negative node Nn lowers, will be described.

As the potential at the positive node Np rises, the p-channel transistor M12 turns off so that current flowing through the source-drain reduces. As the potential at the negative node Nn lowers, the p-channel transistor M13 turns on so that current flowing through the source-drain increases.

The n-channel transistors M14 and M15 constitute a current mirror circuit. The n-channel transistor M15 turns off as the current flowing through the transistor M12 lowers. Since the transistor M15 turns off and the transistor M12 turns on, the potential at the positive output node Voutp rises and eventually to the point of Voutp=H. Namely, if the positive clock Clkp is larger than the negative clock Clkn, the positive input Vinp=H is output from the positive output node Voutp as the signal Data or Strobe shown in FIG. 1.

As the same time, as the potential at the negative node Nn lowers, the p-channel transistor M17 turns on so that the current flowing through the source-drain increases. As the potential at the positive node Np rises, the p-channel transistor M18 turns off so that the current flowing through the source-drain reduces.

The n-channel transistors M19 and M20 constitute a current mirror circuit. As the current of the transistor M17 increases, the n-channel transistor M10 turns on. Since the transistor M18 turns off and the transistor M20 turns on, the potential at the negative output node Voutn lowers and eventually to the point of Voutn=L.

Since the output stage of the positive output node Voutp is paired with the output stage of the negative output node Voutn, a paired differential signal of the signal output from the positive output node Voutp (output node of the signal –Data or –Strobe shown in FIG. 1) is output from the negative output node Voutn (output node of the signal Data or Strobe shown in FIG. 1).

As above, if the positive clock Clkp is larger than the negative clock Clkn, the positive input node Vinp=H is multiplexed as the output node Voutp.

Next, the operation when the differential clocks Clkp and Clkn are the same as above and the positive input node Vinp=L (i.e., –Vinp=H) will be described.

The transistor M1 turns off and the transistor M2 turns on. The potential at the positive node Np lowers and eventually to the point of Np=L. The potential at the negative node Nn rises and eventually to the point of Nn=H.

As the potential at the positive node Np lowers, the gate potential at the transistors M12 and M18 lowers, whereas as the potential at the negative node Nn rises, the gate potential of the transistors M13 and M17 rises.

As a result, the transistor M13 turns off and the current flowing through the source-drain reduces, and the transistor M12 turns on and the current flowing through the source-drain increases. The transistors M14 and M15 constituting the current mirror circuit lower the potential at the positive output node Voutp eventually to the point of Voutp=L. Namely, the positive input node Vinp=L is multiplexed as the output node Voutp.

At the same time, the transistor M18 turns on and the transistor M17 turns off. Therefore, the potential at the negative output node Voutn rises and eventually to the point of Voutn=H.

As above, if the positive clock Clkp is larger than the negative clock Clkn, the signal input to the positive input node Vinp is selected and output from the output node Voutp.

Next, the circuit operation when the negative clock Clkn is larger than the positive clock Clkp will be described In this case, the transistor M6 turns on, and the differential amplifier constituted of the transistors M3 and M4 becomes active. The transistor M5 turns off, and the differential amplifier constituted of the transistors M1 and M2 enters a cut-off state.

The signal of the negative input node Vinn is multiplexed to be output from the positive output node Voutp. The paired differential signal of the signal output from the positive output node Voutp is output from the negative output node Voutn.

The circuit of the differential multiplexer is in perfect symmetry with reference to the differential clocks Clkp and Clkn. Therefore, a change from the state of Clfp>Clkn to the state of Clkp<Clkn is principally the same as a change from the state of Clkp<Clkn to the state of Clkp>Clkn. The obtained differential outputs Voutp and Voutn can realize the low jitter and skew characteristics satisfying the IEEE 1394 specification.

The transistors are not limited only to MOS transistors, but other transistors such ad junction type field effect transistors and bipolar transistors may also be used.

The physical layer (FIG. 1) of this embodiment can perform parallel-serial conversion by using low frequency (200 MHz) clocks and output the signals Data, –Data, Strobe, and –Strobe at a high signal rate (400 Mbps). Furthermore, the jitter and skew of the output signal can be reduced to such an extent that the IEEE 1394 specification can be satisfied.

Since the physical layer can be operated with low frequency clocks, it is not necessary to use sophisticated semiconductor process technologies which are required to realize high speed operation and high precision alignment, so that the manufacture cost can be lowered. Furthermore, since the clock frequency is lowered, the stable operation is ensured while the power consumption is reduced so that market needs can be satisfied.

In the above embodiment, only the transmission of a signal by the physical layer has been mainly described. When the physical layer receives signals Data, –Data, Strobe, and –Strobe, DS decoding is performed to reproduce clocks of 400 MHz. It is not necessary therefore to generate 400 MHz clocks in the physical layer also when the physical layer receives signals.

The clock frequency and output signal rate are not limited only to those described above. For example, output signals having a signal rate of 200 Mbps may be transmitted by using 100 MHz clocks.

The physical layer and differential multiplexer of this embodiment are not limited only to IEEE 1394 serial communications. For example, they may be applied to communications using a universal serial bus (USB) interface.

The present invention has been described in connection with the preferred embodiments. The invention is not limited only to the above embodiments. It is apparent that various modifications, improvements, combinations, and the like can be made by those skilled in the art.

What is claimed is:

1. A differential multiplexer comprising:
   a first differential input pair including first and second transistors, the first differential input pair using as control signals a first input signal and an inverted first input signal;
   a second differential input pair including third and fourth transistors, the second differential input pair using as control signals a second input signal and an inverted second input signal;
   a fifth transistor for making active the first differential input pair by using as a control signal a first clock of first and second clocks forming a pair of differential clocks;

a sixth transistor for making active the second differential input pair by using as a control signal the second clock;

a first constant current source for supplying a constant current to branched paths to the first and third transistors;

a second constant current source for supplying a constant current to branched paths to the second and fourth transistors, the first and second current sources constituting a current mirror;

a first output terminal connected to the branch paths of the second and fourth transistors for outputting the first input signal when the first clock is larger than the second clock, and outputting the second input signal when the second clock is larger than the first clock; and a second output terminal connected to the first and third transistors for outputting a paired differential signal of a signal output from the first output terminal.

2. A differential multiplexer according to claim 1, wherein the first to sixth transistors are MOS transistors.

3. A differential multiplexer according to claim 2, wherein the first and second constant current sources are made of MOS transistors.

4. A differential multiplexer according to claim 1, wherein:

the first to sixth transistors are n-channel MOS transistors each having a gate, a source, and a drain;

the first input signal is applied to the gate of the first transistor, the inverted first input signal is applied to the gate of the second transistor, the second input signal is applied to the gate of the third transistor, the inverted second input signal is applied to the gate of the fourth transistor;

the first clock is applied to the gate of the fifth transistor, and the second clock is applied to the gate of the sixth transistor;

the drain of the fifth transistor is connected to the sources of the first and second transistors, and the source thereof is connected to a ground terminal;

the drain of the sixth transistor is connected to the sources of the third and fourth transistors, and the source thereof is connected to the ground terminal; and the drains of the first and third transistors are connected to the first current source, and the drains of the second and fourth transistors are connected to the second current source.

5. A differential multiplexer according to claim 1, further comprising an output stage connected to the first and second output terminals for current-amplifying the signal output from the first and second output terminals.

6. A differential multiplexer comprising a first differential input pair including first and second transistors, the first differential input pair using as control signals a first input signal and an inverted first input signal;

a second differential input pair including third and fourth transistors, the second differential input pair using as control signals a second input signal and an inverted second input signal;

a fifth transistor for making active the first differential input pair by using as a control signal a first clock of first and second clocks forming a pair of differential clocks;

a sixth transistor for making active the second differential input pair by using as a control signal the second clock;

a first constant current source for supplying a constant current to branched paths to the first and third transistors;

a second constant current source for supplying a constant current to branched paths to the second and fourth transistors, the first and second current sources constituting a current mirror;

a first output terminal connected to the branch paths of the second and fourth transistors for outputting the first input signal when the first clock is larger than the second clock, and outputting the second input signal when the second clock is larger than the first clock;

a second output terminal connected to the first and third transistors for outputting a paired differential signal of a signal output from the first output terminal;

wherein the first to sixth transistors are n-channel MOS transistors each having a gate, a source, and a drain and the first input signal is applied to the gate of the first transistor, the inverted first input signal is applied to the gate of the second transistor, the second input signal is applied to the gate of the third transistor, the inverted second input signal is applied to the gate of the fourth transistor, the first clock is applied to the gate of the fifth transistor, and the second clock is applied to the gate of the sixth transistor, the drain of the fifth transistor is connected to the sources of the first and second transistors, and the source thereof is connected to a ground terminal, the drain of the sixth transistor is connected to the sources of the third and fourth transistors, and the source thereof is connected to the ground terminal, and the drains of the first and third transistors are connected to the first current source, and the drains of the second and fourth transistors are connected to the second current source; and a positive potential power source terminal;

wherein the first and second current sources are seventh and eighth p-channel MOS transistors, respectively, each having a gate, a source, and a drain, the gate of the seventh p-channel MOS transistor is connected to the gate of the eighth p-channel MOS transistor, the drain of the seventh p-channel MOS transistor is connected to the drains of the first and third transistors, the source of the seventh p-channel MOS transistor is connected to the positive potential power source terminal, and the drain of the eighth p-channel MOS transistor is connected to the drains of the second and fourth transistors, and the source of the eighth p-channel MOS transistor is connected to the positive potential power source terminal.

7. A differential multiplexer according to claim 6, further comprising:

a ninth p-channel MOS transistor whose gate and drain are connected in common to the gate of the seventh and eighth p-channel MOS transistors and whose source is connected to the positive potential power source terminal; and a third current source whose one end is connected to the ground terminal and whose another end is connected to the drain of the ninth p-channel MOS transistor.

8. A differential multiplexer according to claim 1, further comprising:

a first inverter for generating the inverted first input signal and outputting the inverted first input signal to the first differential input pair; and a second inverter for generating the inverted second input signal and outputting the inverted second input signal to the second differential input pair.

9. A parallel-serial conversion differential logic circuit comprising:

parallel-serial converting means for converting a parallel signal into a serial signal, the parallel-serial converting means including a plurality of selectors and a plurality of double-edge trigger flip-flops using a first clock as a trigger, the selectors and flip-flops being respectively connected in series;

first serial-parallel converting means for converting the serial signal converted by the parallel-serial converting means into two-bit parallel signals, the first serial-parallel converting means including two single edge trigger flip-flops using a second clock as a trigger, the second clock having a same frequency as the first clock; and a first differential multiplexer for selecting one bit signal of the two-bit parallel signals converted by the first serial-parallel converting means, in accordance with which one of a pair of differential clocks having opposite phases and a same frequency as the first clock is larger, and serially outputting the one bit signal at a speed corresponding to a speed of a clock having a twofold frequency of the first clock.

10. A parallel-serial conversion differential logic circuit according to claim 9, wherein the first differential multiplexer selects one bit signal of the two-bit parallel signals converted by the first serial-parallel converting means and serially outputs a pair of differential signals of the one bit signal having opposite phases at a speed corresponding to a speed of a clock having a twofold frequency of the first clock.

11. A parallel-serial conversion differential logic circuit according to claim 9, further comprising clock generating means for generating the pair of differential clocks and generating the first and second clocks from the pair of generated differential clocks.

12. A parallel-serial conversion differential logic circuit according to claim 9, wherein the first and second clocks are a same clock.

13. A parallel-serial conversion differential logic circuit according to claim 9, further comprising:

an exclusive logical sum circuit for calculating a logical sum of a third clock having a same frequency as the first clock and the serial signal converted by the parallel-serial converting means and outputting the serial signal in accordance with the calculated logical sum;

second serial-parallel converting means for converting the serial signal output from the exclusive logical sum circuit into two-bit parallel signals, the second serial-parallel converting means including two single edge flip-flops using the second clock as a trigger; and a second differential multiplexer for selecting one bit signal of the two-bit parallel signals converted by the second serial-parallel converting means, in accordance with which one of the pair of differential clocks is larger, and serially outputting the one bit signal at a speed corresponding to a speed of a clock having a twofold frequency of the first clock.

14. A parallel-serial conversion differential logic circuit according to claim 13, wherein the first and second differential multiplexers each output a pair of differential signals of the selected one bit signal having opposite phases.

15. A parallel-serial conversion differential logic circuit according to claim 10, wherein the first differential multiplexer comprises:

a first differential input pair including first and second transistors, the first differential input pair using as control signals a first input signal and an inverted first input signal;

a second differential input pair including third and fourth transistors, the second differential input pair using as control signals a second input signal and an inverted second input signal;

a fifth transistor for making active the first differential input pair by using as a control signal a first clock of first and second clocks forming a pair of differential clocks;

a sixth transistor for making active the second differential input pair by using as a control signal the second clock;

a first constant current source for supplying a constant current to branched paths to the first and third transistors;

a second constant current source for supplying a constant current to branched paths to the second and fourth transistors, the first and second current sources constituting a current mirror;

a first output terminal connected to the branch paths of the second and fourth transistors for outputting the first input signal when the first clock is larger than the second clock, and outputting the second input signal when the second clock is larger than the first clock; and a second output terminal connected to the first and third transistors for outputting a paired differential signal of a signal output from the first output terminal.

16. A parallel-serial conversion differential logic circuit according to claim 14, wherein the first and second differential multiplexers each comprises:

a first differential input pair including first and second transistors, the first differential input pair using as control signals a first input signal and an inverted first input signal;

a second differential input pair including third and fourth transistors, the second differential input pair using as control signals a second input signal and an inverted second input signal;

a fifth transistor for making active the first differential input pair by using as a control signal a first clock of first and second clocks forming a pair of differential clocks;

a sixth transistor for making active the second differential input pair by using as a control signal the second clock;

a first constant current source for supplying a constant current to branched paths to the first and second transistors;

a second constant current source for supplying a constant current to branched paths to the second and fourth transistors, the first and second current sources constituting a current mirror;

a first output terminal connected to the branch paths of the second and fourth transistors for outputting the first input signal when the first clock is larger than the second clock, and outputting the second input signal when the second clock is larger than the first clock; and a second output terminal connected to the first and third transistors for outputting a paired differential signal of a signal output from the first output terminal.

17. A differential multiplexer according to claim 6, wherein the first to sixth transistors are MOS transistors.

18. A differential multiplexer according to claim 17, wherein the first and second constant current sources are made of MOS transistors.

19. A differential multiplexer according to claim 6, further comprising an output stage connected to the first and second output terminals for current-amplifying the signal output and the first and second output terminals.

20. A differential multiplexer according to claim 6, further comprising a first inverter for generating the inverted first input signal and outputting the inverted first input signal to the first differential input pair, and a second inverter for generating the inverted second input signal and outputting the inverted second input signal to the second differential input pair.

21. A differential multiplexer according to claim 4, wherein the source of the fifth transistor and the source of the sixth transistor are each directly connected to ground.

* * * * *